United States Patent
Kim et al.

(10) Patent No.: US 12,033,879 B2
(45) Date of Patent: Jul. 9, 2024

(54) TRANSFER APPARATUS HAVING LINK ARMS AND STOCKERS HAVING THE SAME

(71) Applicant: Samsung Electronics Co., Ltd., Suwon-si (KR)

(72) Inventors: Sangmin Kim, Yongin-si (KR); Youngwook Kim, Seoul (KR); Ginam Park, Incheon (KR); Chuljun Park, Seoul (KR); Jeongjae Bang, Suwon-si (KR); Jaesung Byun, Suwon-si (KR); Yongjun Ahn, Suwon-si (KR); Sangkyung Lee, Hwaseong-si (KR); Hyunwoo Lee, Hwaseong-si (KR); Junhyuk Chang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

(21) Appl. No.: 17/683,769

(22) Filed: Mar. 1, 2022

(65) Prior Publication Data

US 2023/0041221 A1    Feb. 9, 2023

(30) Foreign Application Priority Data

Aug. 5, 2021  (KR) .......................... 10-2021-0103189

(51) Int. Cl.
*H01L 21/677*  (2006.01)
*B65G 1/06*    (2006.01)
(Continued)

(52) U.S. Cl.
CPC .......... *H01L 21/67766* (2013.01); *B65G 1/06* (2013.01); *B65G 1/127* (2013.01);
(Continued)

(58) Field of Classification Search
CPC ......... H01L 21/67706; H01L 21/67379; H01L 21/67766; H01L 21/67373; H01L 21/6773;
(Continued)

(56) References Cited

U.S. PATENT DOCUMENTS 5,147,175 A * 9/1992 Tada .................... B25J 9/107
                                                414/744.5
8,414,242 B2   4/2013 Hishiya
(Continued)

FOREIGN PATENT DOCUMENTS

JP    2002-265011 A    9/2002
JP    2007-055698 A    3/2007
KR    100922051 B1    10/2009

*Primary Examiner* — Glenn F Myers
(74) *Attorney, Agent, or Firm* — Harness, Dickey & Pierce, P.L.C.

(57) ABSTRACT

A transfer apparatus includes a lower plate including a lower link arm and a lower support, the lower support being fixed to an upper surface of the lower plate, an upper plate on the lower plate and configured to support a wafer stacking box on an upper surface of the upper plate, the upper plate including an upper link arm, and an upper support that is fixed to the upper surface of the upper plate, and a fixing member that is connected to the upper link arm, the fixing member configured to selectively contact the wafer stacking box. The upper plate is aligned with the lower plate in a first horizontal direction, and is configured to perform linear movement on the lower plate in the first horizontal direction.

20 Claims, 6 Drawing Sheets

(51) Int. Cl.
*B65G 1/127* (2006.01)
*H01L 21/673* (2006.01)

(52) U.S. Cl.
CPC .... *H01L 21/67379* (2013.01); *H01L 21/6773* (2013.01); *B65G 2201/0297* (2013.01)

(58) Field of Classification Search
CPC ........ H01L 21/67769; H01L 21/67724; B65G 1/06; B65G 1/127; B65G 1/0407; B65G 1/0428; B65G 1/0492; B65G 1/0435; B65G 2201/0297
See application file for complete search history.

(56) References Cited

U.S. PATENT DOCUMENTS

| | | | |
|---|---|---|---|
| 9,640,417 | B2 | 5/2017 | Yuk et al. |
| 10,475,684 | B2 | 11/2019 | Ogo |
| 2004/0179930 | A1* | 9/2004 | Kondoh ............ H01L 21/68707 |
| | | | 414/744.2 |
| 2008/0056861 | A1 | 3/2008 | Takahashi et al. |
| 2011/0014018 | A1* | 1/2011 | van Ooyen ............ B65G 1/04 |
| | | | 414/280 |
| 2012/0128455 | A1 | 5/2012 | Tsubaki et al. |

* cited by examiner

TRANSFER APPARATUS HAVING LINK ARMS AND STOCKERS HAVING THE SAME

CROSS-REFERENCE TO RELATED APPLICATION

This application claims priority from Korean Patent Application No. 10-2021-0103189, filed on Aug. 5, 2021 in the Korean Intellectual Property Office, the disclosure of which is incorporated herein by reference in its entirety.

BACKGROUND

1. Field

Example embodiments of the inventive concepts relate to a transfer apparatus having link arms, and a stocker including the same.

2. Description of the Related Art

Various semiconductor equipment and stockers for receiving a wafer may be disposed on a semiconductor production line for manufacture of a semiconductor device. A wafer stacked in a wafer stacking box may be transferred among pieces of process equipment or may be received in a stacking shelf such as a stocker, etc.

SUMMARY

Some example embodiments of the inventive concepts provide a transfer apparatus having link arms, and a stocker including the same.

A transfer apparatus according to some example embodiments of the inventive concepts may include a lower plate including a lower link arm and a lower support, the lower support being fixed to an upper surface of the lower plate, an upper plate on the lower plate and configured to support a wafer stacking box on an upper surface of the upper plate, the upper plate including an upper link arm, and an upper support that is fixed to the upper surface of the upper plate, and a fixing member that is connected to the upper link arm, the fixing member configured to selectively contact the wafer stacking box. The upper plate may be aligned with the lower plate in a first horizontal direction, and may be configured to perform linear movement on the lower plate in the first horizontal direction.

A transfer apparatus according to some example embodiments of the inventive concepts may include a lower plate including at least one lower link arm and a lower support, the lower support being fixed to an upper surface of the lower plate, an upper plate on the lower plate and configured to support a wafer stacking box on an upper surface of the upper plate, the upper plate including at least one upper link arm, and an upper support that is fixed to the upper surface of the upper plate, and at least one fixing member that is connected to the at least one upper link arm, the at least one fixing member configured to selectively contact the wafer stacking box and including a plurality of contact pads. The upper plate may be aligned with the lower plate in a first horizontal direction, and may be configured to perform linear movement on the lower plate in the first horizontal direction.

A stocker according to some example embodiments of the inventive concepts may include shelves that are configured to receive a wafer stacking box, and a transfer apparatus that is configured to be movable among the shelves. The transfer apparatus may include a lower plate including a lower link arm and a lower support, the lower support being fixed to an upper surface of the lower plate, an upper plate that is on the lower plate and is configured to support a wafer stacking box on an upper surface of the upper plate, the upper plate including an upper link arm, and an upper support that is fixed to the upper surface of the upper plate, and a fixing member that is connected to the upper link arm, the fixing member configured to selectively contact the wafer stacking box. The upper plate may be aligned with the lower plate in a first horizontal direction, and may be configured to perform linear movement on the lower plate in the first horizontal direction.

DETAILED DESCRIPTION

Figure 1:
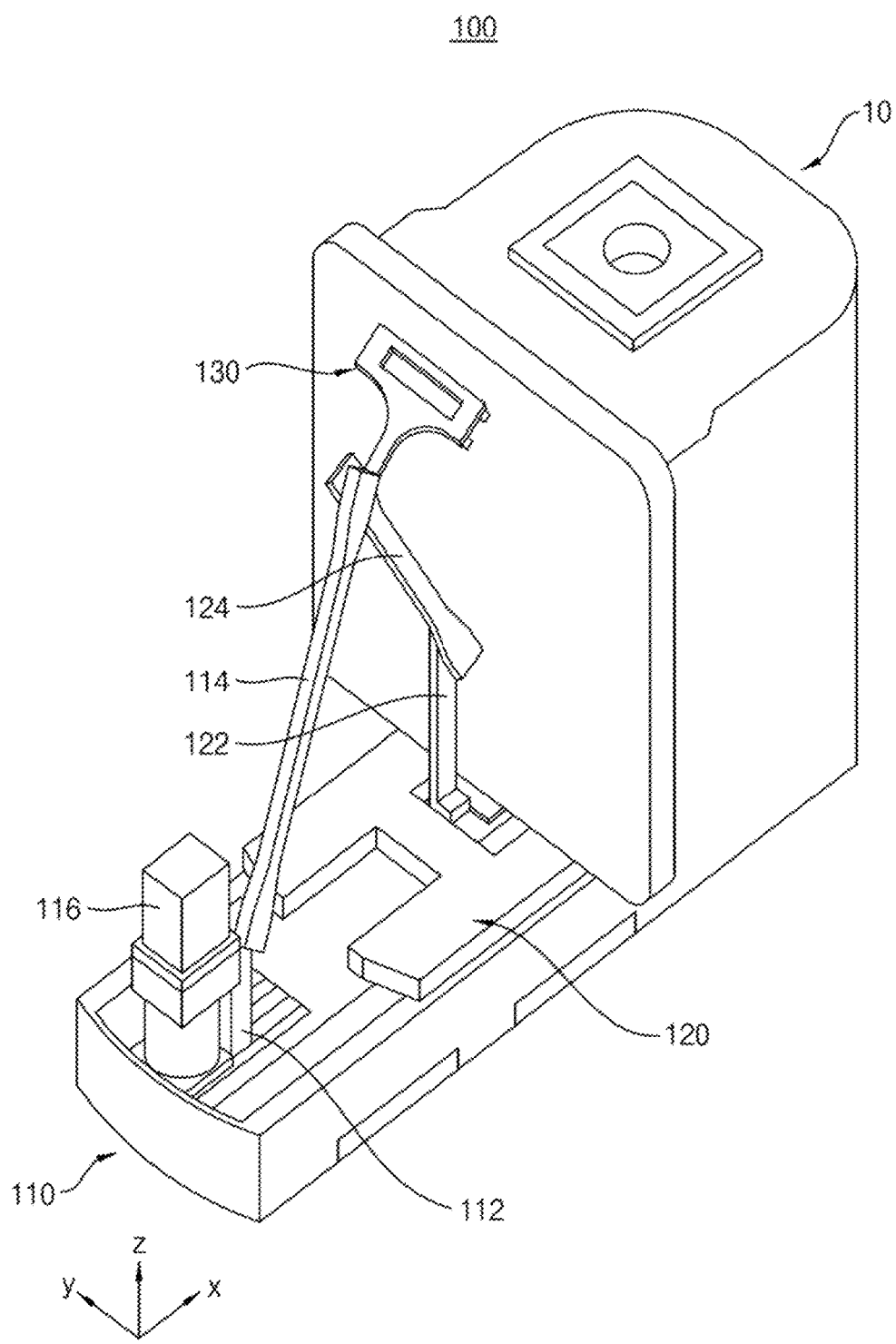
FIG. 1 is a perspective view of a transfer apparatus according to some example embodiments of the inventive concepts.

Hereinafter, some example embodiments according to the spirit and scope of the present inventive concepts will be described with reference to the accompanying drawings. In the description of FIGS. 1 to 9, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a perspective view of a transfer apparatus according to some example embodiments of the inventive concepts.

Referring to FIG. 1, a transfer apparatus 100 may include a lower plate 110, an upper plate 120, and a fixing member 130. The lower plate 110 may be disposed under the upper plate 120, and may include a lower support 112, a lower link arm 114, and a motor 116.

The lower support 112 may be disposed to be fixed to an upper surface of the lower plate 110, and may have a bar shape extending in a vertical direction. The lower link arm 114 may be connected to the lower support 112. For example, one end of the lower link arm 114 may be connected to an end of the lower support 112, and the lower link arm 114 may be disposed to be pivotable with respect to the lower support 112, which is fixed to the lower plate 110. In some example embodiments, the lower link arm 114 may be pivotable on a vertical plane with reference to the end of the lower support 112. The motor 116 may be disposed at the upper surface of the lower plate 110, and may provide drive power required to move the upper plate 120.

The upper plate 120 may be disposed over (e.g., on) the lower plate 110, and a wafer stacking box 10 may be laid on an upper surface of the upper plate 120. The upper plate 120 may be configured to support (e.g., structurally support the load and/or weight of) the wafer stacking box 10 on the upper surface of the upper plate 120. The wafer stacking box 10 may receive wafers therein, and may be transferred by the transfer apparatus 100. In some example embodiments, the wafer stacking box 10 may be a front opening unified pod (FOUP) type stacking box provided with a door to open and close a front side of the stacking box.

The upper plate 120 may be movable on the lower plate 110. For example, the upper plate 120 may be disposed in a state of being aligned with the lower plate 110 in a first horizontal direction x (e.g., may extend in parallel with the lower plate 110 in the first horizontal direction x, for example such that a lower surface of the upper plate 120 and a top surface of the lower plate 110 oppose each other and extend in parallel to each other in at least the first horizontal direction x), and may perform linear movement in the first horizontal direction x on the lower plate 110. In some example embodiments, the lower plate 110 may include a guide rail at an upper portion thereof, and the upper plate 120 may perform linear movement on the guide rail. For example, the upper plate 120 may be configured to move in parallel to the lower plate 110 (e.g., move in the first horizontal direction x in which the top surface of the lower plate 110 extends).

The upper plate 120 may include an upper support 122 and an upper link arm 124. The upper support 122 may be disposed to be fixed to the upper surface of the upper plate 120, and may have a bar shape extending in the vertical direction. The upper link arm 124 may be connected to the upper support 122. For example, one end of the upper link arm 124 may be connected to an end of the upper support 122, and the upper link arm 124 may be disposed to be pivotable with respect to the upper support 122, which is fixed to the upper plate 120. In some example embodiments, the upper link arm 124 may be pivotable on a vertical plane with reference to the end of the upper support 122. The upper link arm 124 may be connected to the lower link arm 114 and, for example, the other end (e.g., opposite end) of the upper link arm 124 may be connected to the other end (e.g., opposite end) of the lower link arm 114. The lower link arm 114 and the upper link arm 124 may be pivotable with respect to each other. As shown, it will be understood that opposite ends (e.g., one end and another end) of the lower link arm 114 may be connected to the lower support 112 and the upper link arm 124, respectively; and opposite ends (e.g., one end and another end) of the upper link arm 124 may be connected to the upper support 122 and the lower link arm 114, respectively.

The fixing member 130 may be connected to the upper link arm 124. The fixing member 130 may selectively contact the wafer stacking box 10, and, for example, may contact an upper portion of the wafer stacking box 10, thereby fixing the wafer stacking box 10 onto the upper plate 120.

Figure 2:
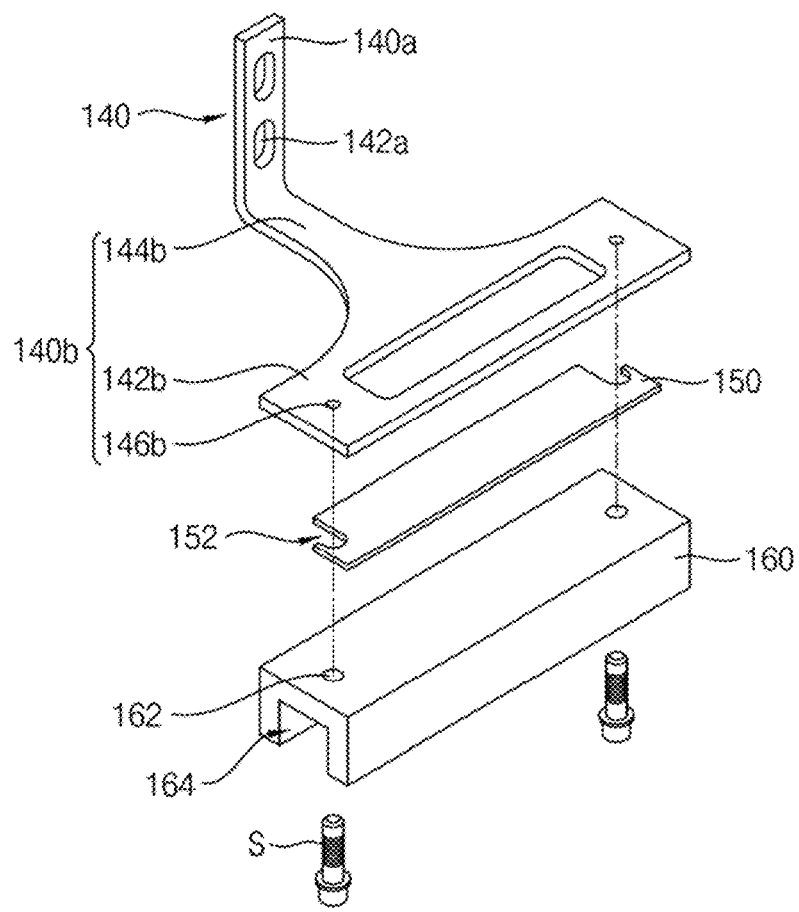
FIG. 2 is an exploded perspective view of the fixing member 130 shown in FIG. 1.

FIG. 2 is an exploded perspective view of the fixing member 130 shown in FIG. 1.

Referring to FIG. 2, the fixing member 130 may include a connection member 140, an adjustment member 150, and a contact pad 160. The connection member 140 may contact the upper link arm 124, thereby fixing the contact pad 160 to the upper link arm 124.

The connection member 140 may include a first connector 140a and a second connector 140b. In some example embodiments, the first connector 140a may be joined to the second connector 140b at a right angle or an angle other than the right angle, and the connection member 140 may have a bent shape. The first connector 140a may contact the upper link arm 124, and may include at least one slot 142a. The second connector 140b may be connected to the first connector 140a, and may include a plate 142b, an extension 144b, and at least one coupling hole 146b. The plate 142b may be directly or indirectly connected to the contact pad 160 in order to fix the contact pad 160 to the first connector 140a. The extension 144b may interconnect the plate 142b and the first connector 140a, and the second connector 140b may have a T shape. The at least one coupling hole 146b may be formed at the plate 142b.

The adjustment member 150 may be disposed between the connection member 140 and the contact pad 160. The adjustment member 150 may have a particular (or, alternatively, predetermined) thickness, and may be used (e.g., may be configured) to adjust the distance between the connection member 140 and the contact pad 160. The adjustment member 150 may have a plate shape, and may include at least one coupling groove 152 corresponding to the at least one coupling hole 146b of the second connector 140b. In some example embodiments, the fixing member 130 may include a plurality of adjustment members 150. Sizes and thicknesses of respective adjustment members 150 may be equal or different. In some example embodiments, the adjustment member 150 may be omitted.

Figure 3:
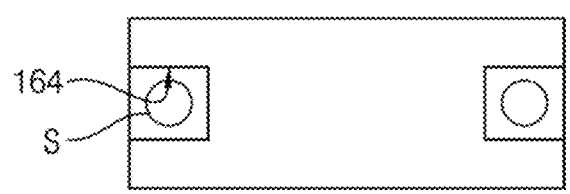
FIG. 3 is a plan view of a contact pad according to some example embodiments of the inventive concepts.

FIG. 3 is a plan view of a contact pad according to some example embodiments of the inventive concepts. FIG. 3 shows a surface of the contact pad opposite to a surface of the contact pad contacting the adjustment member.

Referring to FIGS. 2 and 3, the contact pad 160 may be fixed to the connection member 140. The contact pad 160 may include a coupling hole 162, and a coupling groove 164 at which the coupling hole 162 is disposed. The coupling hole 162 of the contact pad 160 may be aligned with the coupling hole 146b of the connection member 140 and the coupling groove 152 of the adjustment member 150. The fixing member 130 may include a screw S that may be coupled to the coupling hole 162 of the contact pad 160. The screw S may extend through the coupling groove 164 of the contact pad 160, the coupling groove 152 of the adjustment member 150, and the coupling hole 146b of the connection member 140. The connection member 140, the adjustment member 150, and the contact pad 160 may be firmly fastened together by the screw S. The contact pad 160 may be configured to selectively contact the wafer stacking box 10. The contact pad 160 may include a material having elasticity, such as urethane, in order to fix the wafer stacking box 10 in a state of contacting the wafer stacking box 10.

Figure 4:
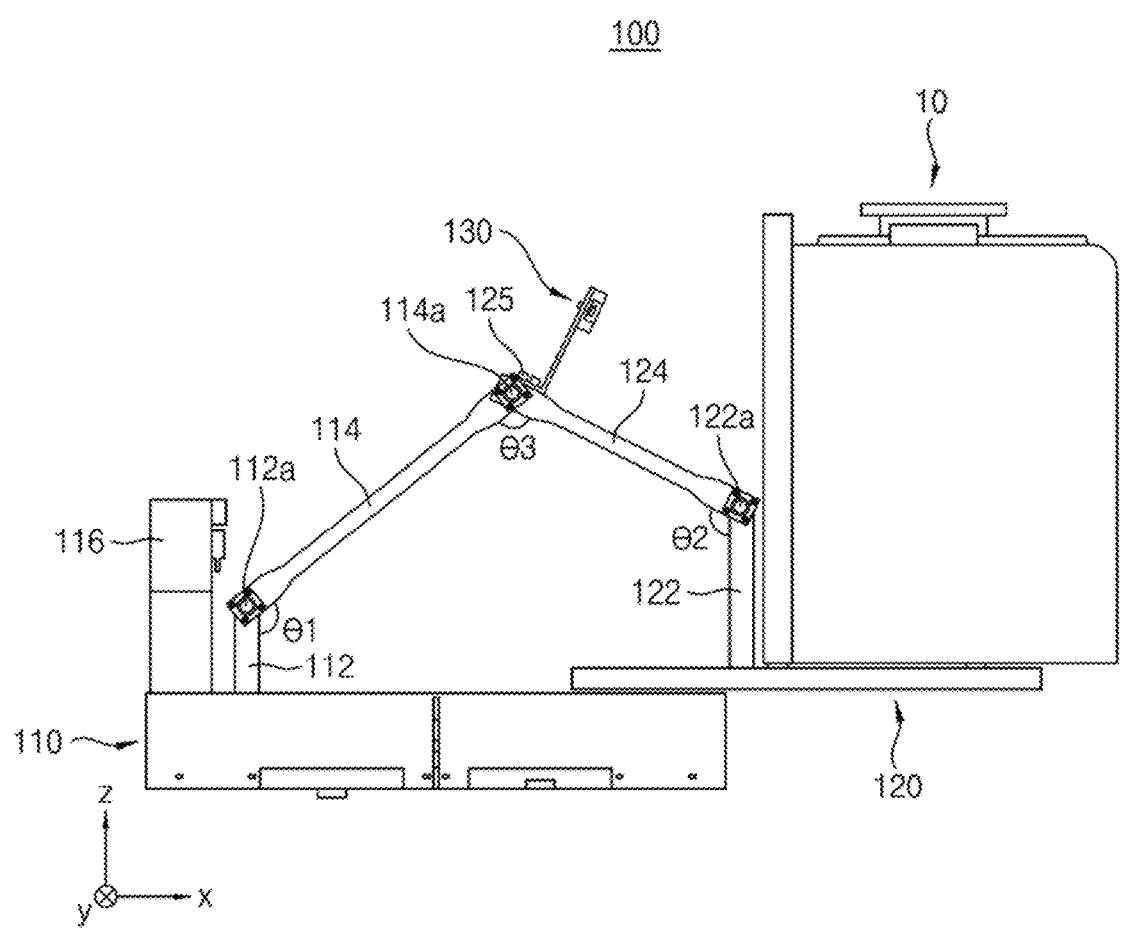
FIGS. 4 and 5 are plan views of the transfer apparatus shown in FIG. 1.

FIG. 4 is a plan view of the transfer apparatus shown in FIG. 1. For example, FIG. 4 is a plan view in a state in which the upper plate is disposed at a first position relatively far from (e.g., distal to) the lower plate.

Referring to FIG. 4, the lower support 112 may include a lower pivot shaft 112a. The lower link arm 114 may be connected to the lower pivot shaft 112a, and may be pivotable about the lower pivot shaft 112a. For example, the lower pivot shaft 112a may extend in a second horizontal direction y, and the lower link arm 114 may perform pivotal movement about the lower pivot shaft 112a in a plane perpendicular to the second horizontal direction y (an xz plane). The lower link arm 114 may also include a connecting pivot shaft 114a connected to the upper link arm 124. For example, the connecting pivot shaft 114a may extend in the second horizontal direction y, and the lower link arm 114 and the upper link arm 124 may perform pivotal movement about the connecting pivot shaft 114a in a plane perpendicular to the second horizontal direction y (an xz plane).

The upper support 122 may include an upper pivot shaft 122a. The upper link arm 124 may be connected to the upper pivot shaft 122a, and may perform pivotal movement about the upper pivot shaft 122a. For example, the upper pivot shaft 122a may extend in the second horizontal direction y, and the upper link arm 124 may perform pivotal movement about the upper pivot shaft 122a in a plane perpendicular to the second horizontal direction y (an xz plane).

As described above, the fixing member 130 may be fixed to the upper link arm 124. For example, the upper link arm 124 may include a coupling member 125 protruding from a surface of the upper link arm 124, and the coupling member 125 may be coupled to the at least one slot 142a of the connection member 140. The coupling member 125 and the at least one slot 142a may be used to adjust a position of the fixing member 130. For example, the position of the fixing member 130 with respect to the upper link arm 124 may be varied in accordance with a position at which the coupling member 125 is coupled to the slot 142a. As shown in FIG. 4, when the upper plate 120 is disposed at the first position relatively far from (e.g., distal to) the lower plate 110, the fixing member 130 may be spaced apart from the wafer stacking box 10.

Figure 5:
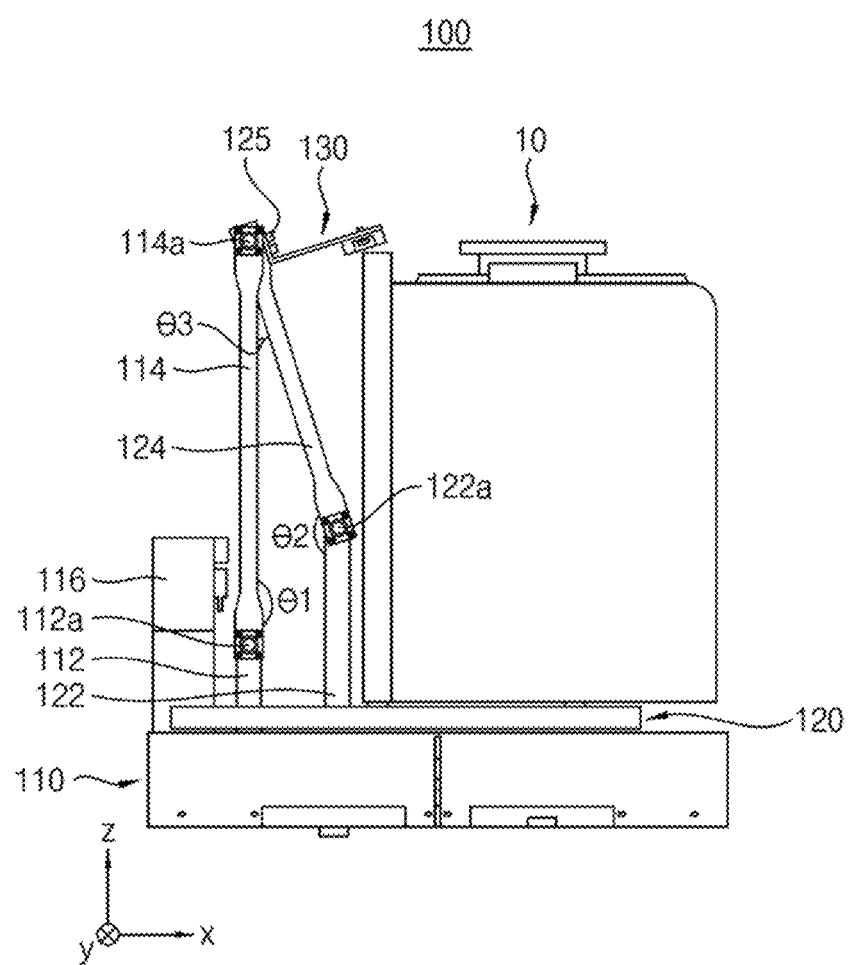
Figure 6:
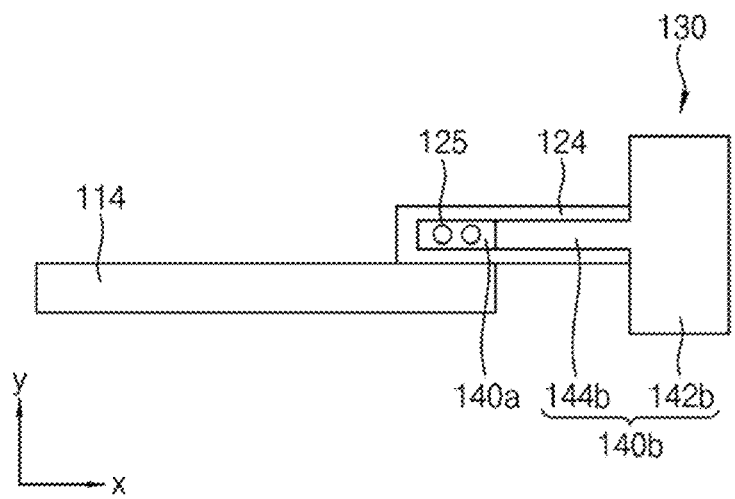
FIG. 6 is a plan view showing link arms and a fixing member according to some example embodiments of the inventive concepts.

FIG. 5 is a plan view of the transfer apparatus shown in FIG. 1. FIG. 6 is a plan view showing link arms and a fixing member according to some example embodiments of the inventive concepts.

Referring to FIGS. 4 to 6, the upper plate 120 may be disposed at a second position relatively near (e.g., proximate to) the lower plate 110. For example, the second position of the upper plate 120 may be proximate to the lower plate 110 in relation to the first position of the upper plate 120. When the upper plate 120 is disposed at the first position, the transfer apparatus 100 may load or unload the wafer stacking box 10, whereas, when the upper plate 120 is disposed at the second position, the transfer apparatus 100 may transfer the wafer stacking box 10. In some example embodiments, the upper plate 120 may perform linear movement in the first horizontal direction x between the first position and the second position. When the upper plate 120 moves from the first position to the second position, the lower link arm 114 and the upper link arm 124 may perform pivotal movement. For example, the lower link arm 114 may pivot in a counterclockwise direction with respect to the lower support 112, and the upper link arm 124 may pivot in a clockwise direction with respect to the upper support 122.

The lower link arm 114 and the upper link arm 124 may move, pivot, etc. in opposite directions with respect to (e.g., around) the connecting pivot shaft 114a, respectively. When the upper plate 120 moves from the first position to the second position, an angle θ1 between the lower link arm 114 and the lower support 112 and an angle θ2 between the upper link arm 124 and the upper support 122 may increase. When the upper plate 120 moves from the second position to the first position, the angle θ1 between the lower link arm 114 and the lower support 112 may decrease and the angle θ2 between the upper link arm 124 and the upper support 122 may decrease. When the upper plate 120 moves from the first position to the second position, an angle θ3 between the lower link arm 114 and the upper link arm 124 may decrease. The angle θ3 between the lower link arm 114 and the upper link arm 124 when the upper plate 120 is at the second position may be smaller than the angle θ3 between the lower link arm 114 and the upper link arm 124 when the upper plate 120 is at the first position.

When the transfer apparatus 100 transfers the wafer stacking box 10, the upper plate 120 may be disposed at the second position relatively near the lower plate 110, and the fixing member 130 may contact the wafer stacking box 10. For example, the fixing member 130 may support the upper portion of the wafer stacking box 10, and the upper plate 120 may support the lower portion of the wafer stacking box 10. When the transfer apparatus 100 transfers the wafer stacking box 10, the upper plate 120 may be disposed at the second position, and the wafer stacking box 10 may be fixed on the upper plate 120 by the fixing member 130 and, as such, may prevent the wafer stacking box 10 and a wafer therein from shaking. Restated, the fixing member 130 may be configured to contact an upper portion of the wafer stacking box 10, and fix the wafer stacking box 10 on the upper plate 120, in response to the upper plate 120 being at the second position. In addition, as described above, the upper plate 120 may perform linear movement on the lower plate 110, thereby preventing generation of vibration caused by pivotal movement.

Figure 7:
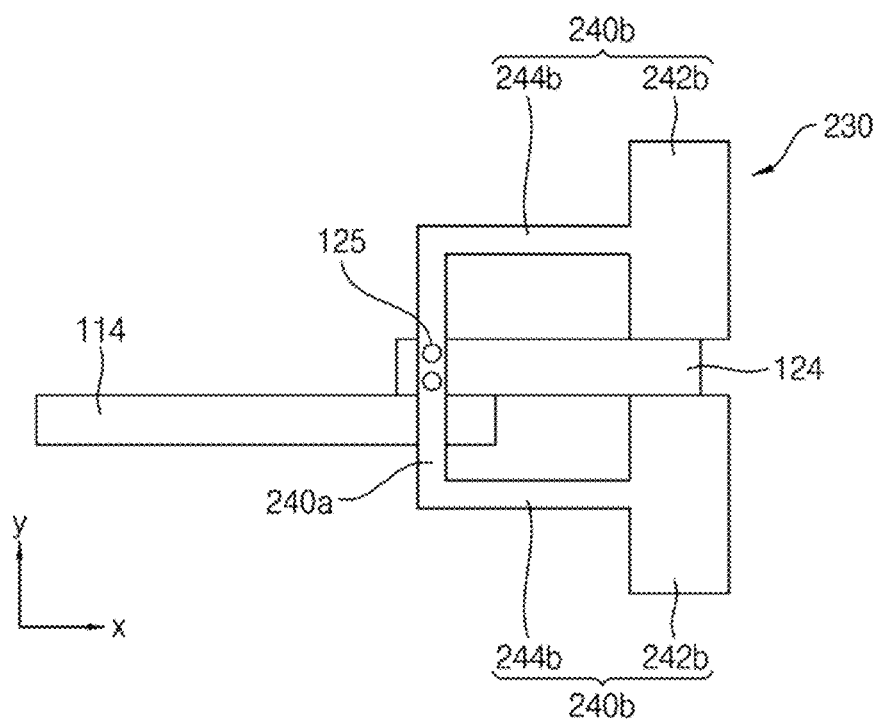
FIGS. 7 and 8 are plan views showing link arms and a fixing member according to some example embodiments of the inventive concepts.
Figure 8:
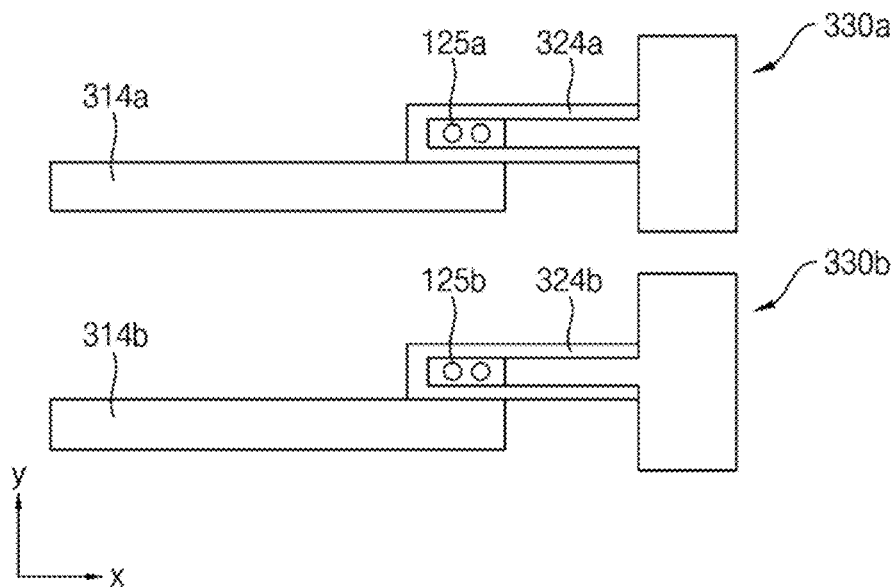

FIGS. 7 and 8 are plan views showing link arms and a fixing member according to some example embodiments of the inventive concepts.

Referring to FIG. 7, the transfer apparatus 100 may include at least one fixing member 230 connected to the upper link arm 124 to selectively contact the wafer stacking box 10. In some example embodiments, the fixing member 230 may include a first connector 240a and two second connectors 240b. The second connectors 240b may be disposed to be spaced apart from each other in the second horizontal direction y under the condition that the upper link arm 124 is interposed therebetween. The first connector 240a may extend in the second horizontal direction y, and may fix the second connectors 240b to the upper link arm 124. For example, each of the second connectors 240b may include a plate 242b and an extension 244b, and the extension 244b may interconnect the first connector 240a and the plate 242b. The fixing member 230 may also include contact pads 160 firmly coupled (e.g., fixed, connected, etc.) to respective plates 242b, for example such that the second connectors 240b may be fixed to separate, respective contact pads 160, and the contact pads 160 may selectively contact the wafer stacking box 10.

Referring to FIG. 8, the transfer apparatus 100 may include a plurality of lower link arms, a plurality of upper link arms, and a plurality of fixing members. For example, the transfer apparatus 100 may include lower link arms 314a and 314b (e.g., first and second lower link arms), upper link arms 324a and 324b (e.g., first and second upper link arms), and fixing members 330a and 330b (e.g., first and second fixing members). The lower link arms 314a and 314b may be disposed to be spaced apart from each other in the second horizontal direction y, and may be connected to corresponding ones of the upper link arms 324a and 324b, respectively, via corresponding coupling members 125a and 125b (e.g., first and second coupling members), respectively. The upper link arms 324a and 324b may be connected to corresponding ones of the fixing members 330a and 330b, respectively, and each of the fixing members 330a and 330b may include a separate contact pad 160.

When the upper plate 120 moves between the first position and the second position, the lower link arms 314a and 314b may move together with the upper link arms 324a and 324b. The contact pads 160 connected to the fixing members 330a and 330b may support the wafer stacking box 10.

Figure 9:
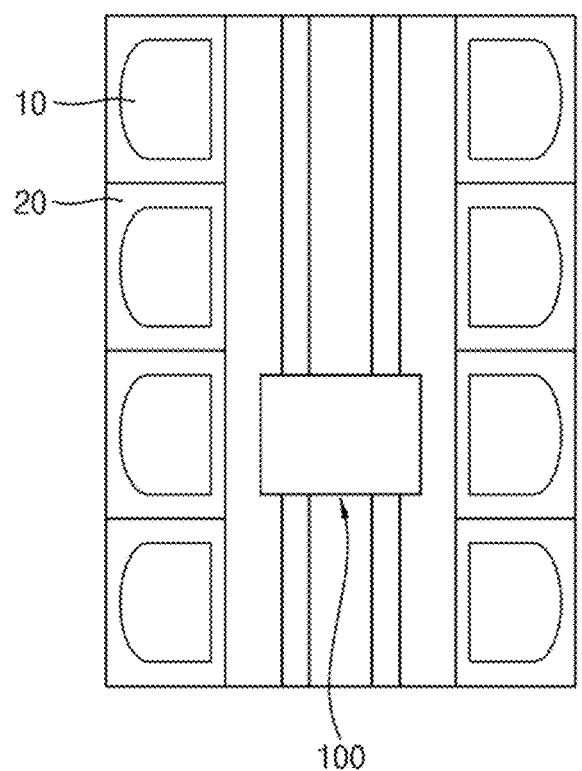
FIG. 9 is a plan view of a stocker according to some example embodiments of the inventive concepts.

FIG. 9 is a plan view of a stocker according to some example embodiments of the inventive concepts. For example, FIG. 9 is a top plan view of the stocker.

Referring to FIG. 9, a stocker ST may include a wafer stacking box 10, a shelf 20, and a transfer apparatus 100. The stocker ST may be used to receive wafer stacking boxes 10 in a semiconductor manufacturing process. The stocker ST may include a plurality of shelves 20 disposed in horizontal and vertical directions and each configured to receive a wafer stacking box 10, and may include the transfer apparatus 100, which is movable among the shelves 20 (e.g., is configured to move among and/or in relation to the shelves 20). The transfer apparatus 100 may move in the horizontal direction along a rail installed in the stocker ST, and may move in the vertical direction by an elevation device. The transfer apparatus 100 may move in the horizontal direction in order to load and unload the wafer stacking box 10 received in the shelf 20, as described above.

In accordance with some example embodiments of the inventive concepts, it may be possible to prevent a wafer stacking box from shaking during transfer thereof.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A transfer apparatus, comprising:
   a lower plate including a lower link arm and a lower support, the lower support being fixed to an upper surface of the lower plate;
   an upper plate on the lower plate, the upper plate configured to support a wafer stacking box on an upper surface of the upper plate, the upper plate including
      an upper link arm, and
      an upper support that is fixed to the upper surface of the upper plate; and
   a fixing member that is connected to the upper link arm, the fixing member configured to selectively contact the wafer stacking box,
   wherein the upper plate is aligned with the lower plate in a first horizontal direction, and the upper plate is configured to perform linear movement on the lower plate in the first horizontal direction.

2. The transfer apparatus according to claim 1, wherein:
   opposite ends of the lower link arm are connected to the lower support and the upper link arm, respectively; and
   opposite ends of the upper link arm are connected to the upper support and the lower link arm, respectively.

3. The transfer apparatus according to claim 2, wherein:
the lower link arm is connected to a lower pivot shaft of the lower support; and
the upper link arm is connected to an upper pivot shaft of the upper support.

4. The transfer apparatus according to claim 2, wherein the upper link arm is connected to a connecting pivot shaft of the lower link arm.

5. The transfer apparatus according to claim 4, wherein the lower link arm and the upper link arm are configured to move in opposite directions about the connecting pivot shaft, respectively.

6. The transfer apparatus according to claim 1, wherein the fixing member includes:
a connection member contacting the upper link arm; and
a contact pad configured to selectively contact the wafer stacking box.

7. The transfer apparatus according to claim 6, wherein the fixing member further includes:
an adjustment member between the connection member and the contact pad, the adjustment member configured to adjust a distance between the connection member and the contact pad.

8. The transfer apparatus according to claim 6, wherein:
the fixing member includes a screw that is configured to fasten the connection member and the contact pad; and
the screw extends through a coupling groove of the connection member and a coupling groove of the contact pad.

9. The transfer apparatus according to claim 6, wherein the connection member includes:
a first connector contacting the upper link arm, the first connector including at least one slot; and
a second connector connected to the first connector and coupled to the contact pad.

10. The transfer apparatus according to claim 9, wherein the slot is coupled to a coupling member of the upper link arm.

11. The transfer apparatus according to claim 1, wherein the upper plate is configured to perform the linear movement between a first position that is distal to the lower plate and a second position that is proximate to the lower plate.

12. The transfer apparatus according to claim 11, wherein the fixing member is configured to contact an upper portion of the wafer stacking box, and fix the wafer stacking box on the upper plate, in response to the upper plate being at the second position.

13. The transfer apparatus according to claim 11, wherein an angle between the lower link arm and the upper link arm when the upper plate is at the second position is smaller than an angle between the lower link arm and the upper link arm when the upper plate is at the first position.

14. The transfer apparatus according to claim 11, wherein, when the upper plate moves from the second position to the first position, an angle between the lower link arm and the lower support decreases, and an angle between the upper link arm and the upper support decreases.

15. A transfer apparatus, comprising:
a lower plate including at least one lower link arm and a lower support, the lower support being fixed to an upper surface of the lower plate;
an upper plate on the lower plate, the upper plate configured to support a wafer stacking box on an upper surface of the upper plate, the upper plate including
at least one upper link arm, and
an upper support that is fixed to the upper surface of the upper plate; and
at least one fixing member that is connected to the at least one upper link arm, the at least one fixing member configured to selectively contact the wafer stacking box, the at least one fixing member including a plurality of contact pads,
wherein the upper plate is aligned with the lower plate in a first horizontal direction, and the upper plate is configured to perform linear movement on the lower plate in the first horizontal direction.

16. The transfer apparatus according to claim 15, wherein the at least one fixing member includes:
a first connector that is connected to the upper link arm; and
second connectors that are connected to the first connector, the second connectors fixed to separate, respective contact pads.

17. The transfer apparatus according to claim 16, wherein the second connectors are spaced apart from one another in a second horizontal direction intersecting the first horizontal direction.

18. The transfer apparatus according to claim 17, wherein the first connector extends in the second horizontal direction.

19. The transfer apparatus according to claim 15, wherein:
the at least one lower link arm includes a first lower link arm and a second lower link arm;
the at least one upper link arm includes a first upper link arm connected to the first lower link arm, and a second upper link arm connected to the second lower link arm; and
the at least one fixing member includes a first fixing member connected to the first upper link arm, and a second fixing member connected to the second upper link arm.

20. A stocker, comprising:
shelves configured to receive a wafer stacking box; and
a transfer apparatus configured to be movable among the shelves,
wherein the transfer apparatus includes
a lower plate including a lower link arm and a lower support, the lower support being fixed to an upper surface of the lower plate,
an upper plate on the lower plate, the upper plate configured to support the wafer stacking box on an upper surface of the upper plate, the upper plate including
an upper link arm, and
an upper support that is fixed to the upper surface of the upper plate, and
a fixing member that is connected to the upper link arm, the fixing member configured to selectively contact the wafer stacking box,
wherein the upper plate is aligned with the lower plate in a first horizontal direction, and is configured to perform linear movement on the lower plate in the first horizontal direction.

* * * * *